(12) United States Patent
Ono

(10) Patent No.: US 7,763,971 B2
(45) Date of Patent: Jul. 27, 2010

(54) CIRCUIT MODULE AND ELECTRICAL COMPONENT

(75) Inventor: Takao Ono, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 73 days.

(21) Appl. No.: 12/175,574

(22) Filed: Jul. 18, 2008

(65) Prior Publication Data

US 2009/0020888 A1   Jan. 22, 2009

(30) Foreign Application Priority Data

Jul. 18, 2007   (JP) ............................. 2007-187258

(51) Int. Cl.
*H01L 23/053*   (2006.01)
(52) U.S. Cl. ...................... 257/701; 257/704
(58) Field of Classification Search .............. 257/686, 257/777, 723, 724, 778, 701, 704
See application file for complete search history.

(56) References Cited

U.S. PATENT DOCUMENTS 6,005,778 A * 12/1999 Spielberger et al. ......... 361/770
6,730,543 B2 * 5/2004 Akram ........................ 438/109
6,777,797 B2 * 8/2004 Egawa ......................... 257/686
7,282,794 B2 * 10/2007 Akram ........................ 257/686
2005/0029645 A1 * 2/2005 Mess et al. .................. 257/686
2005/0035444 A1 * 2/2005 Huang ........................ 257/706
2006/0091518 A1 * 5/2006 Grafe et al. .................. 257/686
2008/0157325 A1 * 7/2008 Chow et al. ................. 257/686
2008/0296784 A1 * 12/2008 Shimanuki ................... 257/784

FOREIGN PATENT DOCUMENTS

| JP | 2001-53243 | 2/2001 |
|---|---|---|
| JP | 2002-110856 | 4/2002 |
| JP | 2002-368185 | 12/2002 |
| JP | 2004-327474 | 11/2004 |
| JP | 2006-49838 | 2/2006 |

* cited by examiner

*Primary Examiner*—S. V Clark
(74) *Attorney, Agent, or Firm*—Young & Thompson

(57) ABSTRACT

In an electrical component including a solid-state circuit portion and a substrate connecting portion, the solid-state circuit portion includes: a supporting surface faced to and supported by the substrate connecting portion; and an opposing surface which is widened outside the supporting surface and which has an area enough to be opposed to another solid-state circuit portion. This structure makes it possible to arrange, on a circuit board, a plurality of the electrical components in a staggered manner in a height direction.

13 Claims, 10 Drawing Sheets

CIRCUIT MODULE AND ELECTRICAL COMPONENT

This application is based upon and claims the benefit of priority from Japanese patent application No. 2007-187258, filed on Jul. 18, 2007, the disclosure of which is incorporated herein in its entirety by reference.

BACKGROUND OF THE INVENTION

1. Field of the Invention

The present invention relates to a circuit module which is operated at a high-speed operation and which is mounted in a high density, and an electrical component used for the circuit module.

2. Description of the Related Art

A high speed operation and a high density mounting have been required of a circuit module, such as a memory module. As an economical high-density mounting technology, recent interest has been mainly directed to stacking solid-state circuit elements in order to mount the circuit module in a high density. In a silicon semiconductor which has presently mainly been used, a proposal has been offered about a technology which perforates a silicon substrate itself to connect upper and lower elements on the silicon substrate to one another. However, this technology still remains inferior to stacking at a package level from the viewpoint of cost.

In Japanese Unexamined Patent Application Publication Nos. 2006-49838, 2001-53243, 2002-368185, and the like, stacking at a package level is performed to form a stacked package and to thereby realize high-density mounting.

Specifically, Japanese Unexamined Patent Application Publication No. 2006-49838 proposes to use balls in order to connect stacked chips to a tape or a substrate member. In addition, Japanese Unexamined Patent Application Publication Nos. 2001-53243 and 2002-368185 propose to use leads and to use a metal compression-bonding method, respectively.

Moreover, Japanese Unexamined Patent Application Publication No. 2002-110856 discloses a manufacturing method for a semiconductor device wherein an interposer individually separated for each element is prepared and is mounted only on a defect-free semiconductor chip on a semiconductor wafer, and electrode pads of the defect-free semiconductor chip and inner bumps of the interposer are bonded together by thermo-compression bonding. Thereafter, the semiconductor chip is individually separated from the semiconductor wafer. In this case, a surface size of the interposer can be equal to or smaller than that of the semiconductor chip and therefore a semiconductor device can be small in size.

Furthermore, Japanese Unexamined Patent Application Publication No. 2004-327474 proposes a technique of shortening a wiring length for an upper-stage device by providing a through hole passing through a device chip itself.

Japanese Unexamined Patent Application Publication Nos. 2006-49838, 2001-53243, and 2002-368185 can realize the high-density mounting by stacking semiconductor chips at a package level, but do not point out any problems which might be caused to occur on stacking the semiconductor chips at a package level.

Further, Japanese Unexamined Patent Application Publication No. 2002-110856 discloses that the surface size of the interposer which supports the semiconductor chip can be equal to or smaller than that of the semiconductor chip and therefore the semiconductor device can be small in size. In this case, the interposer can be smaller than the semiconductor chip by a size such that each semiconductor chip supported by the interposer can be cut out. For that reason, the semiconductor chip supported by the interposer does not keep large space enough to be opposed to another semiconductor chip.

The technique of Japanese Unexamined Patent Application Publication No. 2004-327474 needs to mechanically process chips. Therefore, the technique does not propose any method of solving any problem related to a package alone.

SUMMARY OF THE INVENTION

An object of the present invention is to provide a circuit module obtained by solving the problems occurring in the case where semiconductor chips are stacked on each other at a package level.

Another object of the present invention is to provide an electrical component constituting the circuit module.

First, as disclosed in Japanese Unexamined Patent Application Publication Nos. 2006-49838, 2001-53243, and 2002-368185, in the case of stacking semiconductor chips on each other at a package level, a lower-stage semiconductor chip has to be connected to an upper-stage semiconductor chip by a signal line which is arranged so as to go around the lower-stage semiconductor chip in a longitudinal direction. This inevitably makes the wiring length longer and results in an increase of impedance. Such an increase of impedance becomes bar for a high speed operation of the circuit module.

Now, the principle of the present invention will be described about a memory module such as a dynamic random access memory (DRAM).

In a circuit board, such as a memory module, onto which a plurality of identical memory devices are mounted, methods for connecting address signal lines shared between the plurality of memory devices are classified into the following two methods: a method of simultaneously delivering identical signal information to the plurality of memory devices (referred to as open stub system in some cases); and a method of successively delivering signal information to the plurality of memory devices at certain intervals of time (referred to as fly-by method or daisy chain method in some cases; hereinafter, mentioned as the fly-by method).

In the case of the fly-by method, impedance is widely varied in comparison with the case where the devices are not stacked. This is because in the fly-by method, capacitances and inductances between each device stacked and its wiring line are successively added at every connection point between each device and the circuit board. As a result, a signal quality tends to be deteriorated by reflection of signals and the like.

The present invention specifically realizes a method of mounting each device in a high density with any deterioration of the signal quality suppressed, even when the high-density mounting is performed on the circuit board by the use of the fly-by system.

That is, when the fly-by system is adopted, wiring capacitances and inductances of packages or input/output circuits of the devices are increased at each point of connection of the devices. This brings about a large variation of impedance. The present invention aims to suppress the deterioration of the signal quality by lowering the variation of impedance. Specifically, the stacking of devices has been mainly used so far for the high-density mounting, but is disadvantageous in that a greater variation of impedance takes place on a shared signal pin, in comparison with the case of the non-stacking.

The present invention solves the above-mentioned problems without stacking memory devices on each other. To this end, a device of the stacked devices is moved in position to another point located on a shared signal line so that the device moved is partially overlapped with another device. This shows that the plurality of the devices have a staggered arrangement in a height direction.

Specifically, according to a first aspect of the present invention, there is obtained an electrical component which comprises a solid-state circuit portion having a semiconductor as a base substance and a substrate connecting portion for electrically mounting the solid-state circuit portion on an external substrate, wherein the solid-state circuit portion comprises:

a supporting surface opposed to a mounting surface of the substrate connecting portion and supported by the substrate connection portion; and an opposing surface which is widened outside the supporting surface and which has an area enough to be opposed to another solid-state circuit portion.

According to a second aspect of the present invention, there is obtained an electrical component, wherein the substrate connecting portion comprises a first connecting portion connected to the supporting surface of the solid-state circuit portion and a second connecting portion which is mounted to the external substrate to define the mounting surface equal to a size of the supporting surface of the solid-state circuit portion.

According to a third aspect of the present invention, there is obtained an electrical component, wherein the substrate connecting portion comprises the mounting surface which is mounted to the external substrate and which has the same size as the supporting surface and a connecting surface which is connected to the solid-state circuit portion and which has an area equal to or larger than a sum of the supporting surface and the opposing surface of the solid-state circuit portion.

According to a fourth aspect of the present invention, there is obtained an electrical component, wherein the substrate connecting portion comprises a first connecting portion which defines the mounting surface of the substrate connecting portion and which has an area equal to or larger than a sum of the supporting surface and the opposing surface of the solid-state circuit portion and a second connecting portion which is mounted to the external substrate and which has the same area as the supporting surface of the solid-state circuit portion.

According to a fifth aspect of the present invention, there is obtained an electrical component, wherein at least a portion of the solid-state circuit portion is resin-molded.

According to a sixth aspect of the present invention, there is obtained an electrical component, wherein the solid-state circuit portion has a structure in which a plurality of solid-state circuit components are stacked on each other.

According to a seventh aspect of the present invention, there is obtained an electrical component, wherein the substrate connecting portion is connected to a center portion of the solid-state circuit portion.

According to an eighth aspect of the present invention, there is obtained an electrical component, wherein the substrate connecting portion is connected to a location different from a center portion of the solid-state circuit portion.

According to a ninth aspect of the present invention, there is obtained a circuit module which comprises a circuit board and a plurality of electrical components mounted on the circuit board, wherein the plurality of electrical components are arranged in a staggered manner so that adjacent electrical components of the plurality of electrical components partially overlap in a height direction.

According to a tenth aspect of the present invention, there is obtained a circuit module, wherein each of the plurality of electrical components comprises a solid-state circuit portion having a semiconductor as a base substance and a substrate connecting portion for electrically mounting the solid-state circuit portion on the circuit board, wherein the solid-state circuit portion comprises a supporting surface which is faced to a mounting surface of the substrate connecting portion and which is supported by the substrate connecting portion and an opposing surface which is widened outside the supporting surface and which has an area enough to be opposed to another solid-state circuit portion.

According to an eleventh aspect of the present invention, there is obtained a circuit module, wherein the solid-state circuit portion comprises a dynamic random access memory.

That is, according to the present invention, the solid-state circuit portion having a semiconductor as a base substance includes the opposing surface provided to the outside of the supporting surface and having an area sufficient to be opposed to another solid-state circuit portion besides the supporting surface opposed to the substrate connecting portion. With this structure, the solid-state circuit portion can be arranged together with another solid-state circuit portion in the staggered manner.

According to the present invention, in the circuit module in which the above-mentioned electrical components are arranged in the staggered manner, a wiring length of the shared signal line does not double. Also, intervals for connection are made half. This serves to prevent an increase in the total length of the shared signal line. As a result, the deterioration of the signal quality due to the increase in wiring length of the shared signal line can be suppressed. Further, according to the present invention, the stacking is unnecessary and thus a package in which a distance from a circuit board to an input/output circuit of a device is short can be employed, so a wiring capacity in the package and the inductance are reduced to suppress the deterioration of the signal quality in the package. As described above, the capacity and the inductance can be reduced, so attenuation of a waveform is reduced even in a high frequency region. Also, with a reduction in impedance variation in the shared signal line on the circuit board, it is possible to lower occurrence of a reflected wave at an impedance unmatched point.

Moreover, the area of the substrate connecting portion connected to a circuit board (for example, mother board or memory module substrate) is made smaller than the area of a solid-state circuit element so that adjacent solid-state circuit elements can be opposed to each other. Accordingly, the staggered mounting in the height direction is enabled on the circuit board, and the degree of lowering the mounting density can be reduced. Under specific conditions, the mounting density similar to that of the stacked package is also enabled. Conventionally, only a component thinner than a diameter of a solder ball has been mounted close to a pin of a signal line. However, as a secondary advantage, the application of the present invention allows a component thicker than the diameter of a solder ball to be mounted close to the pin of the signal line. Further, the width of the substrate connecting portion is made narrow, and thus the cost thereof can be reduced.

DETAILED DESCRIPTION OF THE EXEMPLARY EMBODIMENTS

Figure 1:
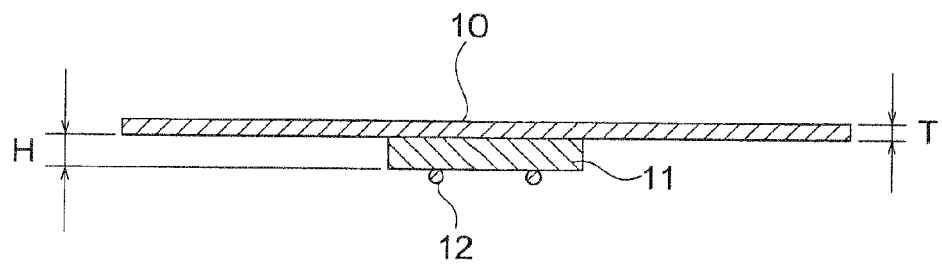
FIG. 1 is an explanatory diagram showing an electrical component according to a first embodiment of the present invention.

Referring to FIG. 1, an electrical component according to a first embodiment of the present invention has a solid-state circuit portion 10 including, as a base substance, a semiconductor such as silicon, and a substrate connecting portion 11 provided to a lower surface of the solid-state circuit portion 10. As illustrated in FIG. 1, the substrate connecting portion 11 has an area smaller than that of the solid-state circuit portion 10. The substrate connecting portion 11 has an upper surface electrically connected to the solid-state circuit portion 10 and a lower surface connected to an external substrate (that is, circuit board (not shown)). In other words, the solid-state circuit portion 10 has a lower surface which is opposed to the substrate connecting portion 11 and which has a support surface supported by the substrate connecting portion 11 and an opposing surface placed outside of the support surface. The opposing surface has a wide area enough to be opposed to another electrical component.

As described above, the solid-state circuit portion 10 is provided with the opposing surface of the wide area which can be opposed to another solid-state circuit component. Therefore, this structure serves to arrange a plurality of solid-state circuit components in a height direction in a staggered manner. Therefore, the mounting density of the electrical components can be improved.

The illustrated substrate connecting portion 11 has the lower surface, that is, a mounting surface side for a circuit board and the upper surface faced to the solid-state circuit portion 10. The mounting surface side of the substrate connecting portion 11 is provided with solder balls 12 while the upper surface faced to the solid-state circuit portion 10 is provided with bonding pads (not shown). The illustrated substrate connecting portion 11 is attached to a center portion of the solid-state circuit portion 10 with the bonding pads, which enables to shorten wiring paths on the substrate connecting portion 11 and thus leads to an improvement of electrical characteristics. Further, the substrate connecting portion 11 is remarkably smaller in size than the solid-state circuit portion 10, whereby stress generated therebetween can be lowered and reliability in connection points is improved.

It is to be noted in FIG. 1 that a thickness (T) of the illustrated solid-state circuit portion 10 is thinner than a thickness (H) of the substrate connecting portion 11.

Figure 2:
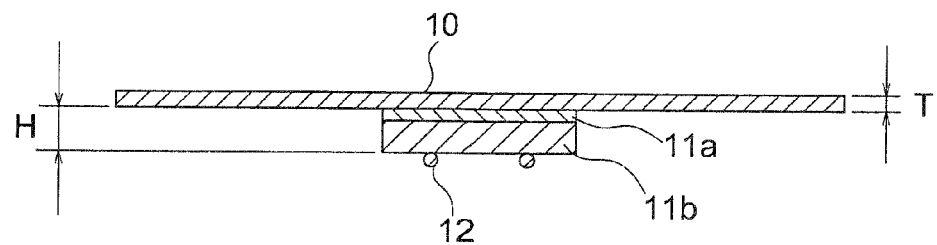
FIG. 2 is a diagram showing an electrical component according to a first modification of the present invention.

Referring to FIG. 2, an electrical component according to a first modification of the present invention is shown. The illustrated substrate connecting portion has a first connecting component 11a which provides a surface identical in size with the support surface of the solid-state circuit portion 10. The first connecting component 11a is electrically connected to the solid-state circuit portion 10. In the illustrated example, a second connecting component 11b is bonded to the first connecting component 11a and has the same size as that of the first connecting component 11a. On the lower surface of the second connecting component 11b, solder balls 12 are placed to be connected to the external substrate. Any other structure illustrated in FIG. 2 is similar to that of the electrical component shown in FIG. 1.

Figure 3:
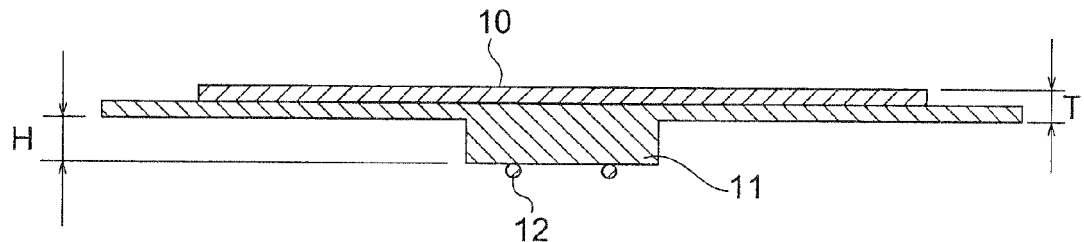
FIG. 3 is a diagram showing an electrical component according to a second modification of the present invention.

Referring to FIG. 3, an electrical component according to a second modification of the present invention includes the solid-state circuit portion 10 and the substrate connecting portion 11. The substrate connecting portion 11 has, on the lower side thereof, a substrate mounting surface having the same size as that of the supporting surface of the solid-state circuit portion 10, and on the upper side thereof, a solid-state circuit connecting surface having a larger area than the sum of the supporting surface and the opposing surface of the solid-state circuit portion 10. In other words, the substrate connecting portion 11 shown in FIG. 3 includes an integrated single component which defines the substrate mounting surface and the circuit connecting surface both of which are different from each other in size. The thickness (H) of the portion defining the substrate mounting surface of the illustrated substrate connecting portion 11 is thicker than the thickness (T) of the portion defining the circuit connecting surface. The above-description is made about the case where the solid-state circuit connecting surface of the illustrated substrate connecting portion 11 is larger than the sum of the supporting surface and the opposing surface of the solid-state circuit portion 10. However, the solid-state circuit connecting surface of the substrate connecting portion 11 may have the same size of area as that of the solid-state circuit portion 10.

Figure 4:
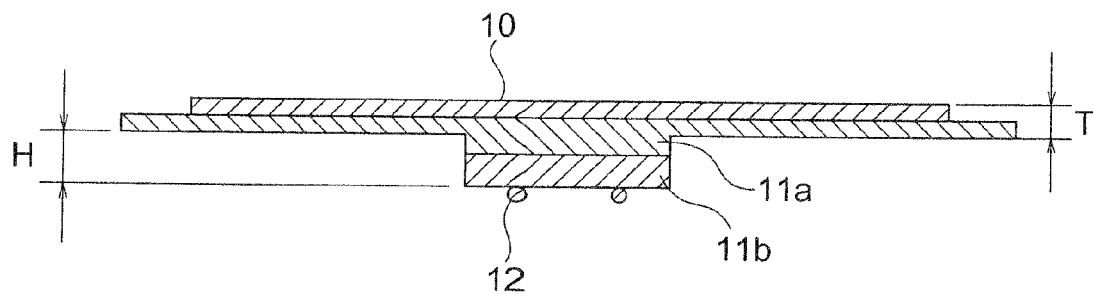
FIG. 4 is a diagram showing an electrical component according to a third modification of the present invention.

Referring to FIG. 4, an electrical component according to a third modification of the present invention is different from that of FIG. 3 in the substrate connecting portion 11 in which the first connecting portion 11a defining the connecting surface connected to the solid-state circuit portion 10 and the second connecting portion 11b defining the substrate mounting surface are separately formed. Other components thereof are the same as those in FIG. 3.

Figure 5:
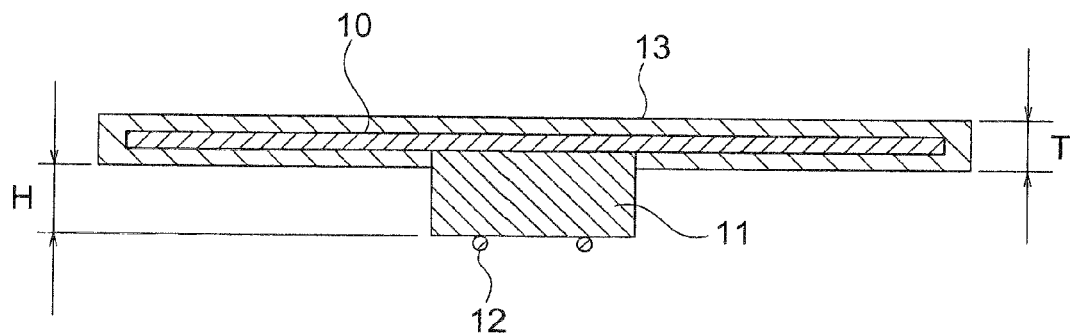
FIG. 5 is a diagram showing an electrical component according to a fourth modification of the present invention.
Figure 6:
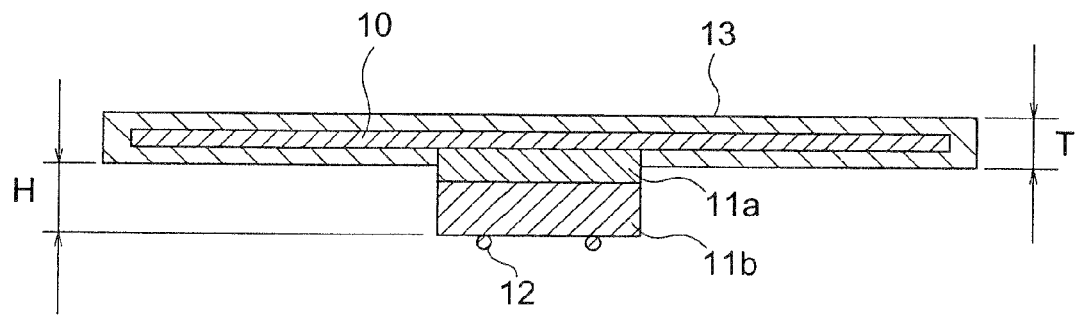
FIG. 6 is a diagram showing an electrical component according to a fifth modification of the present invention.

Referring to FIG. 5, an electrical component according to a fourth modification of the present invention includes the solid-state circuit portion 10 and a molded portion 13. The molded portion 13 is obtained by removing a supporting portion of the solid-state circuit portion 10 and by molding the solid-state circuit 10 except for the supporting portion. An electrical component according to the fifth modification of the present invention shown in FIG. 6 relates to the fourth modification shown in FIG. 5. Specifically, like in FIG. 2, the electrical component shown in FIG. 6 has the substrate connecting portion 11 including the first connecting portion 11a connected to the supporting surface of the solid-state circuit portion 10 and the second connecting portion 11b having the solder balls 12 to be connected to the external substrate (circuit board) and defining the substrate mounting surface of the same size as that of the first connecting portion 11a. In this case, the total thickness (H) of the first and second connecting portions 11a and 11b is set to be thicker than the thickness (T) of the solid-state circuit portion 10 covered by the molded portion 13.

Figure 7:
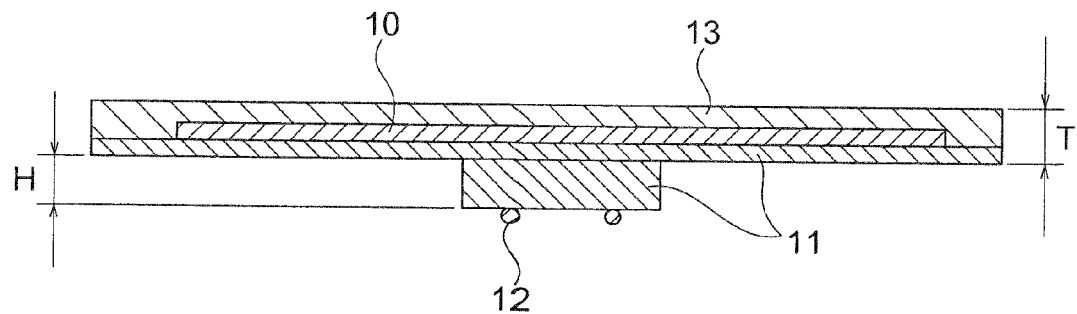
FIG. 7 is a diagram showing an electrical component according to a sixth modification of the present invention.

Referring to FIG. 7, an electrical component according to a sixth modification of the present invention is covered by the molded portion 13 on a side of the solid-state circuit portion 10 opposite to the substrate connecting portion 11. Moreover, the illustrated substrate connecting portion 11 includes the first connecting portion having a wider area than that of the solid-state circuit portion 10 and defining the connecting surface, and the second connecting portion having the same size as that of the supporting surface of the solid-state circuit portion 10. In this case, the first connecting portion and the second connecting portion are separately formed. The total thickness (T) of the first connecting portion of the substrate connecting portion 11, the solid-state circuit portion 10, and the molded portion 13 is set to be thinner than the thickness (H) of the second connecting portion of the substrate connecting portion 11.

Figure 8:
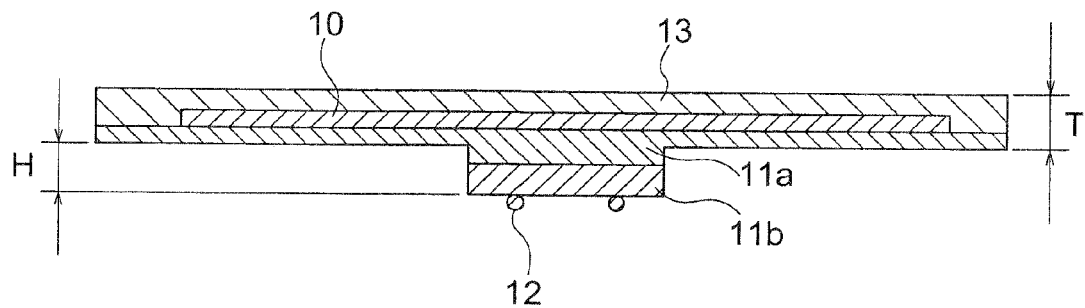
FIG. 8 is a diagram showing an electrical component according to a seventh modification of the present invention.

Referring to FIG. 8, an electrical component according to a seventh modification of the present invention has a structure in which the solid-state circuit portion 10 including the molded portion 13 shown in FIG. 7 is combined with the first and second connecting portions 11a and 11b shown in FIG. 4.

Figure 9:
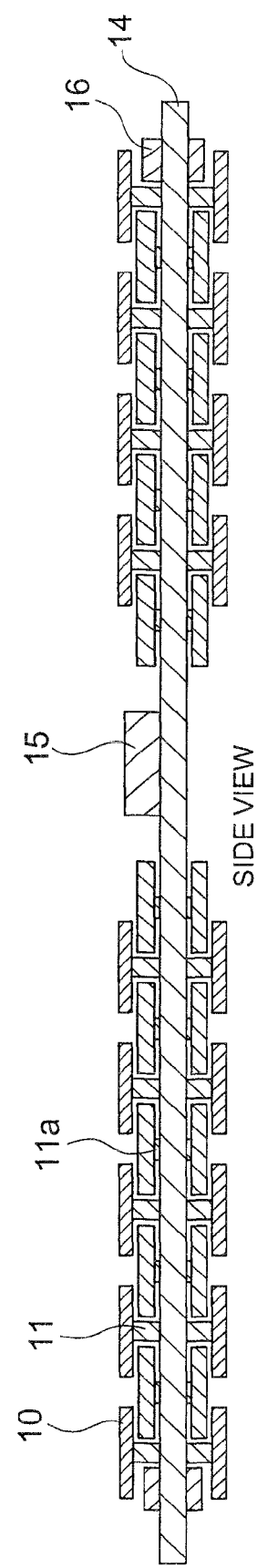
FIG. 9 is an explanatory side view showing a circuit module including electrical components arranged in a staggered manner according to a second embodiment of the present invention.
Figure 10:
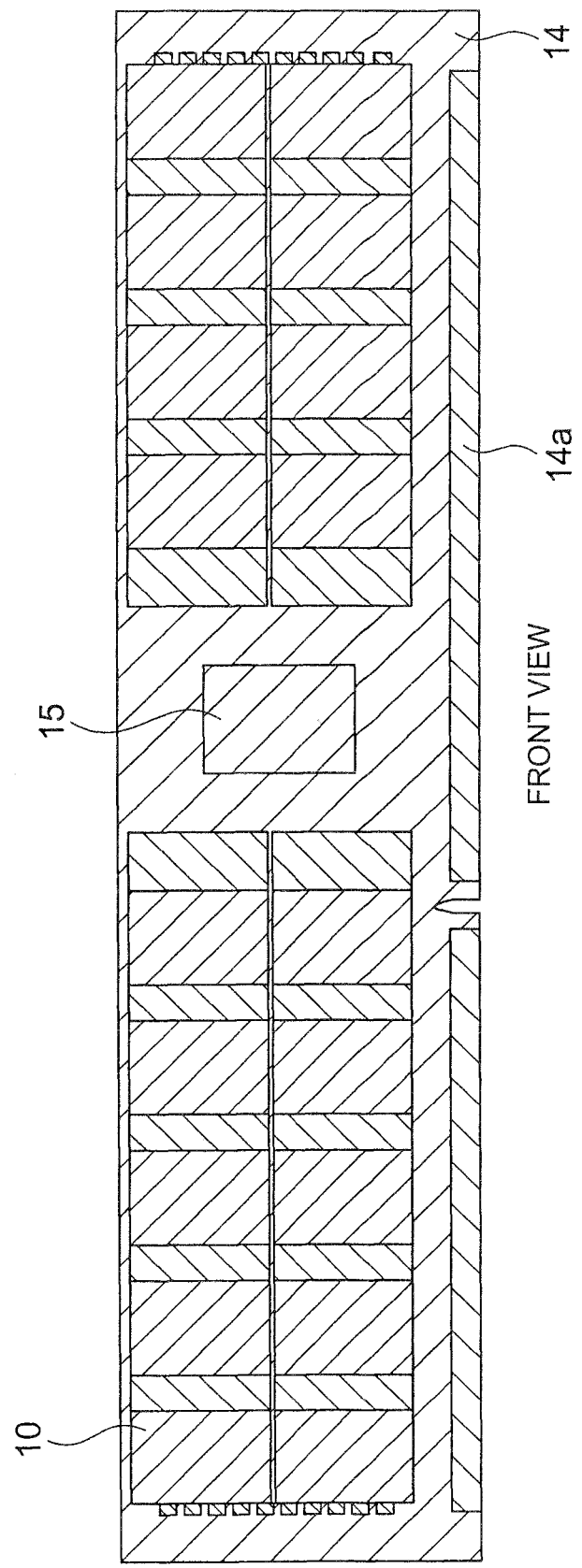
FIG. 10 is a front view of the circuit module shown in FIG. 9.

Referring to FIGS. 9 and 10, there are shown a side view and a front view of a circuit module according to a second embodiment of the present invention, respectively. In the illustrated circuit module, a plurality of electrical components are mounted on a circuit board 14 in addition to a logical circuit 15 such as a controller. In the example shown in the figures, electrical components different from each other in height are arranged on the front surface and back surface of the circuit board 14 in the height direction in the staggered manner so as to partially oppose adjacent electrical components to each other. That is, in the example shown in the figures, of the electrical components shown in FIGS. 1 to 8, electrical components including the substrate connecting portions 11 and 11a which are different from each other in height are alternately arranged on the circuit board 14. Also, in FIG. 9, a circuit element (for example, capacitor) 16 whose height is higher than that of the solder ball 12 is arranged on the lower portion of the electrical component. Further, as is apparent from FIG. 10, the solid-state circuit portion 10 of the electrical component is arranged substantially with no gap between another solid-state circuit portion 10, and in addition, a signal terminal 14a is arranged in the vicinity of each of the electrical components.

In order to explain advantages obtained by the structure of the circuit module according to the present invention, a description will be made compared with a circuit module having a stacked structure.

Figure 11:
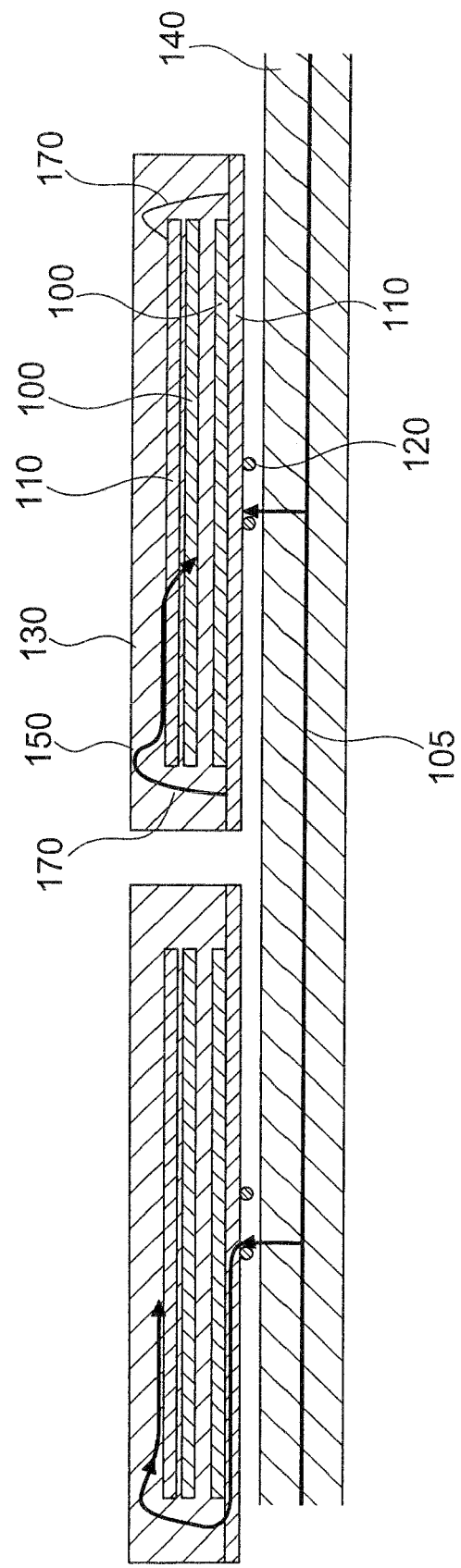
FIG. 11 is a circuit module of a comparative example, which is used for explaining advantages of the circuit module according to the present invention.
Figure 12:
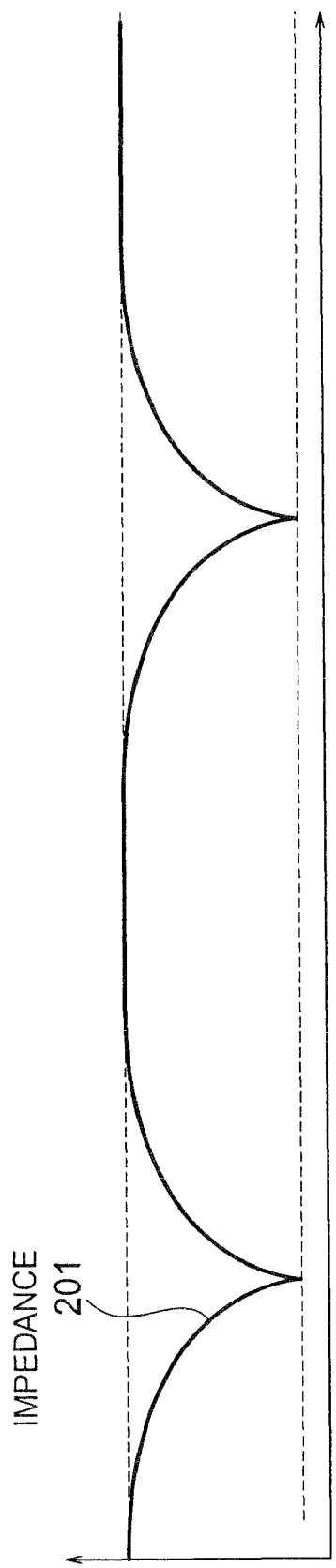
FIG. 12 is a diagram showing impedance of the comparative example shown in FIG. 11.

Referring to FIG. 11, an example of the circuit module having a stacked structure is shown, and the illustrated circuit module includes the structure in which two electrical components 130 are mounted on a circuit board 140. Each of the illustrated electrical components 130 is connected to a common signal wiring 105 and includes two solid-state circuit portions 100 and supporting members 110 each of which supports each of the solid-state circuit portions 100. The solid-state circuit portion 100 of a lower stage and the solid-state circuit portion 100 of an upper stage are arranged so as to be opposed to each other. Moreover, the supporting member 110 of an upper stage and the supporting member 110 of a lower stage are electrically connected to each other by a metal wiring 170. With this structure, a current 150 flows into the solid-state circuit portion 100 of the upper stage from the common signal wiring 105, via the metal wiring 170, and the supporting member 110 of the upper stage. The current path has a length substantially equal to the total length of the two solid-state circuit portions 100. A variation of impedance 201 in the current path is shown in FIG. 12.

Figure 13:
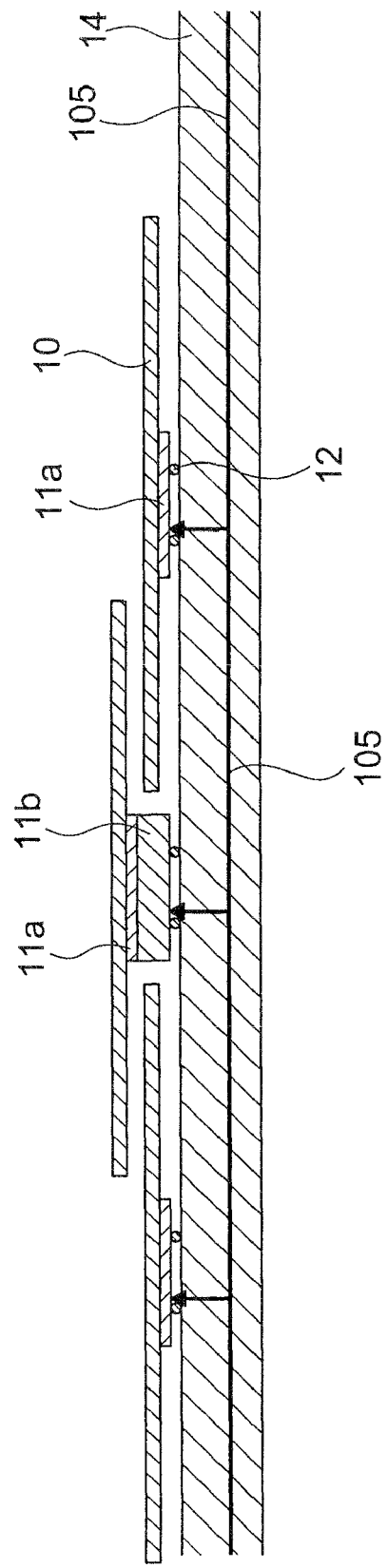
FIG. 13 is a diagram showing a schematic structure of the circuit module according to the present invention.
Figure 14:
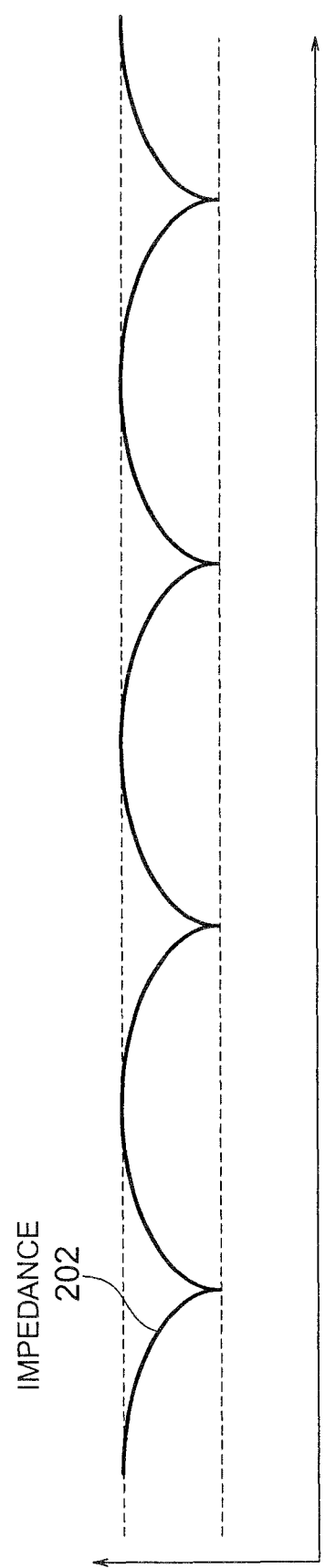
FIG. 14 is a diagram showing impedance of the circuit module shown in FIG. 13.

Referring to FIG. 13, in the circuit module according to the present invention, a distance between the common signal wiring 105 and each of the solid-state circuit portions 10 is substantially equal to the height (H) of the substrate connecting portions 11a and 11b. Accordingly, the circuit module shown in FIG. 13 has an impedance 202 as shown in FIG. 14, which is markedly small compared with that of FIG. 12.

The above-mentioned embodiments of the present invention have thus far been described about the examples in which the substrate connecting portion is arranged at the center of the solid-state circuit portion, but the present invention is not limited thereto.

Figure 15:
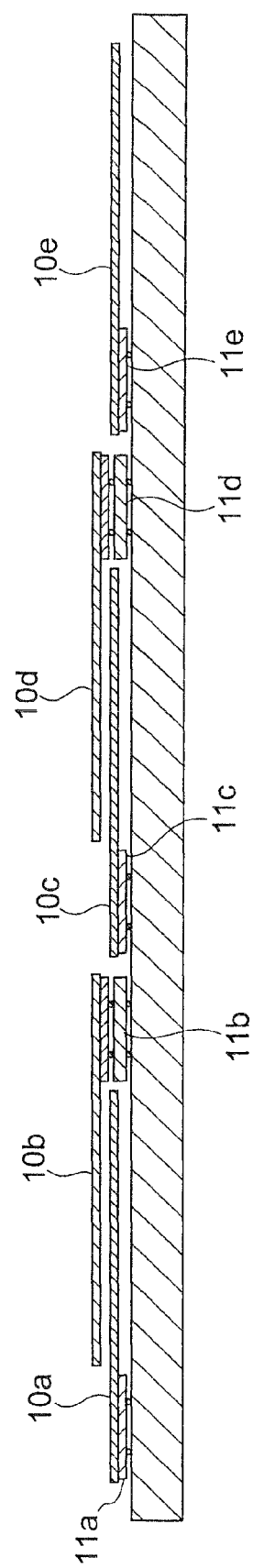
FIG. 15 is a side view showing a circuit module according to a third embodiment of the present invention.

Referring to FIG. 15, there is shown a circuit module according to a third embodiment of the present invention, in which substrate connecting portions 11a to 11e are connected to portions which are not center portions of solid-state circuit portions 10a to 10e. In the example shown in the figure, the substrate connecting portions 11a, 11c, and 11e are provided to the portions located close to the left ends of the solid-state circuit portions 10a, 10c, and 10e, respectively. Meanwhile, the substrate connecting portions 11b and 11d are provided to the portions located close to the right ends of the solid-state circuit portions 10b and 10d, respectively. Further, the substrate connecting portions 11b and 11d are higher than the other substrate connecting portions 11a, 11c, and 11e. In this embodiment, a structure in which two tapes, substrates, or the like, are laminated is adopted and therefore the staggered arrangement is enabled.

In addition, the embodiment shown in the figure has been described on the assumption that the solid-state circuit portion connected to the substrate connecting portion is a single semiconductor chip, but the present invention is not limited thereto and may have a structure in which a plurality of semiconductor chips are stacked on each other.

The present invention is applicable not only to a memory module such as a DRAM but also to any other devices such as a server or router which requires high-speed and high-density mounting and in which a large number of identical devices are mounted. Moreover, the present invention is applicable to a circuit which requires reduction of a power-supply noise in a high-speed application of a communication system.

What is claimed is:

1. An electrical component, comprising:
   a solid-state circuit portion having a semiconductor as a base substance; and
   a substrate connecting portion for electrically mounting the solid-state circuit portion on an external substrate, wherein the solid-state circuit portion comprises:
   a supporting surface opposed to a mounting surface of the substrate connecting portion and supported by the substrate connection portion; and
   an opposing surface which is widened outside the supporting surface and which has an area enough to be opposed to another solid-state circuit portion, and
   wherein the substrate connecting portion comprises:
   the mounting surface which is mounted to the external substrate and which has the same size as the supporting surface; and
   a connecting surface which is connected to the solid-state circuit portion and which has an area equal to or larger than a sum of the supporting surface and the opposing surface of the solid-state circuit portion.

2. An electrical component according to claim 1, wherein the substrate connecting portion comprises a first connecting portion connected to the supporting surface of the solid-state circuit portion and a second connecting portion which is mounted to the external substrate to define the mounting surface equal to a size of the supporting surface of the solid-state circuit portion.

3. An electrical component, comprising:
   a solid-state circuit portion having a semiconductor as a base substance; and
   a substrate connecting portion for electrically mounting the solid-state circuit portion on an external substrate,
wherein the solid-state circuit portion comprises:
   a supporting surface opposed to a mounting surface of the substrate connecting portion and supported by the substrate connection portion; and
   an opposing surface which is widened outside the supporting surface and which has an area enough to be opposed to another solid-state circuit portion, and
wherein the substrate connecting portion comprises:
   a first connecting portion which defines the mounting surface of the substrate connecting portion and which has an area equal to or larger than a sum of the supporting surface and the opposing surface of the solid-state circuit portion; and
   a second connecting portion which is mounted to the external substrate and which has the same area as the supporting surface of the solid-state circuit portion.

4. An electrical component according to claim 1, wherein at least a portion of the solid-state circuit portion is resin-molded.

5. An electrical component according to claim 1, wherein the solid-state circuit portion has a structure in which a plurality of solid-state circuit components are stacked on each other.

6. An electrical component according to claim 1, wherein the substrate connecting portion is connected to a center portion of the solid-state circuit portion.

7. An electrical component according to claim 1, wherein the substrate connecting portion is connected to a location different from a center portion of the solid-state circuit portion.

8. A circuit module, comprising:
   a circuit board; and
   a plurality of electrical components mounted on the circuit board,
   wherein the plurality of electrical components are arranged in a staggered manner so that adjacent electrical components of the plurality of electrical components partially overlap in a height direction,
wherein each of the plurality of electrical components comprises:
   a solid-state circuit portion having a semiconductor as a base substance; and
   a substrate connecting portion for electrically mounting the solid-state circuit portion on the circuit board,
wherein the solid-state circuit portion comprises:
   a supporting surface which is faced to a mounting surface of the substrate connecting portion and which is supported by the substrate connecting portion; and
   an opposing surface which is widened outside the supporting surface and which has an area enough to be opposed to another solid-state circuit portion.

9. A circuit module according to claim 8, wherein the solid-state circuit portion comprises a dynamic random access memory.

10. An electrical component according to claim 3, wherein at least a portion of the solid-state circuit portion is resin-molded.

11. An electrical component according to claim 3, wherein the solid-state circuit portion has a structure in which a plurality of solid-state circuit components are stacked on each other.

12. An electrical component according to claim 3, wherein the substrate connecting portion is connected to a center portion of the solid-state circuit portion.

13. An electrical component according to claim 3, wherein the substrate connecting portion is connected to a location different from a center portion of the solid-state circuit portion.

* * * * *